United States Patent [19]

Mashiro et al.

[11] Patent Number: 5,552,955

[45] Date of Patent: Sep. 3, 1996

[54] SUBSTRATE REMOVAL METHOD AND MECHANISM FOR EFFECTING THE METHOD

[75] Inventors: Supika Mashiro, Tokorozawa; Tomoaki Osada, Tokyo, both of Japan

[73] Assignee: Anelva Corporation, Fuchu, Japan

[21] Appl. No.: 364,314

[22] Filed: Dec. 27, 1994

[30] Foreign Application Priority Data

Feb. 3, 1994 [JP] Japan .................................. 6-011798

[51] Int. Cl.$^6$ .................................................. H02N 13/00
[52] U.S. Cl. ........................................ 361/234; 361/213
[58] Field of Search ...................................... 361/213, 230, 361/231, 233, 234

[56] References Cited

U.S. PATENT DOCUMENTS

| | | |
|---|---|---|
| 4,184,188 | 1/1980 | Briglia . |
| 4,384,918 | 5/1983 | Abe . |
| 4,399,016 | 8/1983 | Tsukada et al. . |
| 4,480,284 | 10/1984 | Tojo et al. . |
| 4,502,094 | 2/1985 | Lewin et al. . |
| 4,554,611 | 11/1985 | Lewin . |
| 4,645,218 | 2/1987 | Ooshio et al. . |
| 4,665,463 | 5/1987 | Ward et al. . |
| 4,692,836 | 9/1987 | Suzuki . |
| 4,724,510 | 2/1988 | Wicker et al. . |
| 4,962,441 | 10/1990 | Collins . |
| 4,990,229 | 2/1991 | Campbell et al. . |
| 5,055,964 | 10/1991 | Logan et al. . |
| 5,099,571 | 3/1992 | Logan et al. . |
| 5,103,367 | 4/1992 | Horwitz et al. . |
| 5,104,834 | 4/1992 | Watanabe et al. . |
| 5,122,251 | 6/1992 | Campbell et al. . |
| 5,151,845 | 9/1992 | Watanabe et al. . |
| 5,160,152 | 11/1992 | Toraguchi et al. . |
| 5,166,856 | 11/1992 | Liporace et al. . |
| 5,179,498 | 1/1993 | Hongoh et al. . |

(List continued on next page.)

FOREIGN PATENT DOCUMENTS

| | | |
|---|---|---|
| 63-49752 | 10/1988 | Japan . |
| 2-20369 | 5/1990 | Japan . |
| 2-122741 | 10/1990 | Japan . |
| 5-47910 | 2/1993 | Japan . |

OTHER PUBLICATIONS

Electrostatic Clamping Applied to Semiconductor Plasma Processing; J. F. Daviel and L. Peccoud; J. Electrochem, Soc., vol. 140, NO. 11, Nov. 1993.

Relationship between Electrical Rsistivity and Electrostatic force of Allumina Electrostatic Chuck; Toshiya Watanabe et al.; Jpn. J. Appl. Phys. vol. 32 (1993) pp. 864–871, Part1, NO. 2, Feb. 1993.

Electrostatec Force and Absorption current of Alumina Electrostatic Chuck; Toshiya Watanabe et al.; Jpn. J. Appl. Phys. vol. 31 (1992) pp. 2145–2150; Part 1, No. 7, Jul. 1992.

Neutralization of Static Electricity by Using Ionizing of Gas Molecules; Hitoshi Inaba et al.; pp. 16–22; Ultra Clean Technology, 1994.

*Primary Examiner*—Fritz Fleming
*Attorney, Agent, or Firm*—Burns, Doane, Swecker & Mathis, LLP

[57] ABSTRACT

A method for rapidly, reliably, and safely removing a substrate from an electrostatic clamping electrode and a mechanism for effecting the method. The method comprises forming a gap between an electrode and a substrate which had been made to hold onto the electrode by electrostatic clamping to increase the electrostatic potential between the substrate and the electrode, generating a DC-glow-discharge in the vicinity of the substrate according to Paschen's law, and removing the substrate from the electrode after eliminating the static charge from the substrate using gas molecules charged by the DC-glow-discharge. A mechanism for effecting the method comprises a means for introducing a gas, a protruding means, a means for controlling the pressure, a sequencer for sequentially activating them, and a lifting mechanism for adjusting the height of the protruding means to the gap distance necessary for generating a DC-glow-discharge between the substrate and the electrode.

22 Claims, 2 Drawing Sheets

U.S. PATENT DOCUMENTS

| | | |
|---|---|---|
| 5,191,506 | 3/1993 | Logan et al. . |
| 5,207,437 | 5/1993 | Barnes et al. . |
| 5,213,349 | 5/1993 | Elliott . |
| 5,221,403 | 6/1993 | Nozawa et al. . |
| 5,221,450 | 6/1993 | Hattori et al. . |
| 5,250,137 | 10/1993 | Arami et al. . |
| 5,255,153 | 10/1993 | Nozawa et al. . |
| 5,310,453 | 5/1994 | Fukasawa et al. ............... 156/643 |
| 5,315,473 | 5/1994 | Collins et al. . |
| 5,350,479 | 9/1994 | Collins et al. ............... 156/345 |
| 5,382,311 | 1/1995 | Ishikawa et al. ............... 156/345 |

SUBSTRATE REMOVAL METHOD AND MECHANISM FOR EFFECTING THE METHOD

BACKGROUND OF THE INVENTION

1. Industrial Field of the Invention

The present invention relates to a method for removing a substrate and a mechanism for effecting the same. More specifically, the present invention relates to a method for quickly, reliably, and safely removing a substrate from an electrode onto which the substrate is held by electrostatic clamping, and to a substrate removal mechanism for effecting the method.

2. Discussion of Related Art

According to an electrostatic clamping method, a substrate is held onto an electrode by applying a uniform electrostatic clamping force over the entire substrate. Essentially, this method is suitable for holding a large substrate. Therefore, the method of holding a substrate by electrostatic clamping is widely prevailing with the recent increase in the size of the substrates.

In holding a substrate by electrostatic clamping, in general, a DC-voltage is applied to an electrode to generate an electric potential difference between the substrate and the electrode. Furthermore, a dielectric material is interposed between the substrate and the electrode to accumulate a static charge between the substrate and the electrode. However, there is a problem in that the substrate still remains clamped to the electrode even after the application of the DC voltage to the electrode is stopped. This is due to the remnant clamping force generated by a residual static charge inside the dielectric material. It is therefore difficult to rapidly, reliably, and safely remove the substrate once it is held onto an electrode by electrostatic clamping.

Prior art techniques for removing a substrate held onto an electrode by electrostatic clamping can be generally, classified into the following two categories.

(A) Methods using a mechanical means:

(A-1) a method comprising making a pin protrude from the surface of the electrode; and (A-2) a method comprising removing the substrate from the electrode by utilizing the expansion force of a pressurized gas introduced between the substrate and the electrode through an inlet pipe provided inside the electrode.

(B) Methods using an electrical means:

(B-1) a method comprising canceling out the residual static lingering charge inside the dielectric material provided between the substrate and the electrode by inverting the polarity of the DC-voltage;

(B-2) a method comprising eliminating the clamping force by grounding both the electrode and the substrate; and (B-3) a method, in case the substrate is a semiconductor wafer, comprising eliminating the residual static charge by ceasing the application of a DC voltage during plasma generation, thereby allowing the residual static charge to dissipate.

However, the aforementioned prior art techniques still suffer, either in principle or in practice, from the following problems.

(A) Problems concerning substrate removal by physical force utilizing a mechanical means:

(A-1) In the method comprising the protruding of a pin from the surface of the electrode, a removal force is exerted to a local portion of the substrate with the uniform application of the electrostatic clamping force to the entire substrate. The local exertion of the removal force leads to the deformation or breakage of the substrate.

Moreover, particulate debris tends to be generated due to the friction between the pin and the substrate.

(A-2) In the method comprising utilizing the expansion of pressurized gas, the substrate is sometimes blown up vigorously at the very instance the substrate is leaving the electrode. The blown-up substrate falls and may be accidentally broken.

(B) Problems concerning the elimination of the residual static charge utilizing an electric means:

(B-1) In cases where the polarity of the residual static charge is canceled out by inverting the polarity of the applied voltage, it is practically impossible to completely eliminate the residual static charge by a single polarity inversion. Accordingly, to overcome the incomplete elimination, this method inevitably requires several polarity inversions of the applied voltage while gradually lowering the applied voltage to finally attain a voltage of zero. This polarity inversion method requires at least several tens of seconds to remove the substrate.

(B-2) In the method of grounding both the electrode and the substrate, if a thin film of dielectric material (e.g., an $SiO_2$ film) is formed on the rear surface of the substrate the grounding method is not practical because the decay time necessary to completely eliminate the residual static charge of the dielectric film is too long.

(B-3) In the method of dissipating the residual static charge by exposing a plasma to the substrate after ceasing the application of a DC-voltage, there is a fear that the temperature of the substrate will rise due to plasma heating. Furthermore, if the time duration for the plasma exposure to the substrate is set inappropriately after ceasing the application of DC-voltage the residual static charge may still remain present in a large quantity, or worse still, by the self-bias voltage which is induced at the substrate due to the plasma exposure, the substrate is charged up again. The electrostatic clamping force cannot be sufficiently lowered by the plasma exposure method.

OBJECT OF THE SUMMARY

In light of the aforementioned circumstances, an object of the present invention is to provide a method for quickly, reliably, and safely removing the substrate from the electrode, and also a mechanism for effecting the same.

The aforementioned problems can be overcome by the following means.

The electric potential difference between the electrode and the substrate electrostatically clamped thereto is increased by forming a gap therebetween, and an electric glow discharge is generated in the vicinity of the substrate by taking advantage of the increased potential difference between the substrate and the electrode while also using the gas present in the peripheral atmosphere of the substrate (hereinafter referred to as "ambient gas"). The gas particles which are charged up by the electric glow discharge eliminates the static charge accumulated on the substrate. Finally, after the elimination of the static charge, the substrate, free from charge, is removed from the electrode.

An electric glow discharge can be generated in the vicinity of the substrate by setting the distance between the substrate and the electrode in such a manner that the electric potential of the substrate with respect to the ground attains the voltage required to start an electric glow discharge, and controlling the pressure of the ambient gas according to Paschen's law.

The distance between the electrode and the substrate is preferably set to within a range of from about 0.1 mm to about 1 mm.

The pressure of the ambient gas is set to within a range of from 0.1 Pa to 500 Pa at the distance range as above.

The potential difference between the substrate and the electrode is proportional to the distance between them.

The potential of the substrate with respect to the ground increases with the increasing distance of the gap between the substrate and the electrode.

The electric discharge which is formed in the vicinity of the substrate is a DC-discharge.

The substrate is removed from the electrode after the electric potential difference between the substrate and the electrode drops to a voltage required for a self-sustaining discharge or lower than that. In case of an 8-inch diameter substrate, for instance, the substrate is removed from the electrode when the surface potential is lowered to 220 V or lower.

The ambient gas is air, an inert gas, nitrogen gas, or mixture of these. Preferably, nitrogen gas is introduced at flow rate of 200 sccm under a pressure of 20 Pa.

Otherwise, the ambient gas may be a gas for processing the substrate. For instance, the gas for use in processing the substrate is a mixture of $CF_4$ and $O_2$ gases, or a mixture of $CF_4$ and $CHF_3$ gases.

To form a gap between the substrate and the electrode, a pin is made to protrude from the surface of the electrode.

The height of the protruding pin is such that the substrate does not suffer damage. Preferably, the height of the substrate is controlled to within a range of from about 0.1 mm to about 1 mm.

The mechanism according to the present invention, for effecting the method above, comprises an electrostatic clamping mechanism for holding the substrate onto the electrode by electrostatic clamping, a protruding means which is provided on the surface of the electrode for forming a gap between the substrate and the electrode, a gas inlet for introducing gas in order to provide an ambient gas suitable for generating an electric glow discharge in the vicinity of the substrate, a means for controlling the gas pressure of the ambient gas to a constant value, and a sequencer for sequentially activating the gas inlet means, the projecting means, and the pressure-control means.

Preferably, the protruding means is placed below the portion other than the edge of the substrate. More specifically, for instance, four protruding means may be arranged such that they are spaced at equal distances along the circumference of a circle having a diameter less than that of the substrate. Otherwise, for example, a protruding means comprising a circular pedestal that is smaller in diameter than the substrate at the end thereof is provided at the center. When the circular pedestal is retracted into the electrode, its surface is coplanar with the surface of the electrode.

More preferably, the substrate removal mechanism according to the present invention comprises a lifting mechanism which controls the height of the protruding means to such an extent that the lifting substrate does not be suffer damage.

DESCRIPTION OF THE PREFERRED EMBODIMENTS

Figure 1:
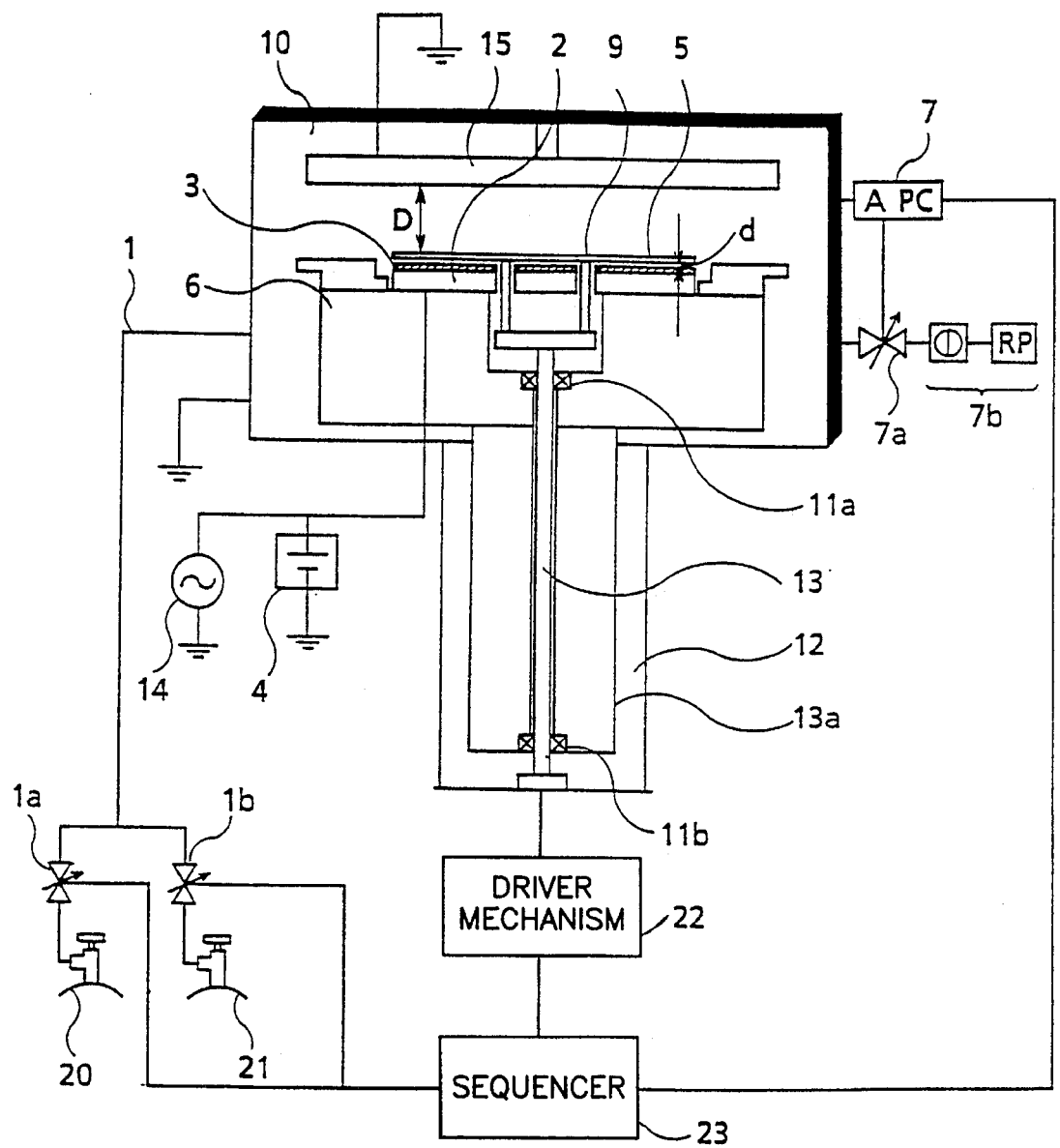
FIG. 1 is a lateral cross-sectional view of a substrate removal mechanism according to the present invention, which is built in a process chamber for parallel plate-type reactive-ion etching.

The generation of a DC-glow-discharge in the vicinity of the substrate plays an important role in the present invention. The gas molecules that are charged up by the DC glow discharge eliminate the residual static charge lingering on the substrate.

The conditions for generating a DC-glow-discharge depend on (1) the electric potential $\Phi s$ of the substrate with respect to the earth, (2) the distance D between the substrate and the grounded components or members in the vicinity of the substrate (e.g., the electrode opposed to the substrate or the wall of the vacuum vessel), and (3) the pressure P of the ambient gas existing in the vicinity of the substrate. More precisely, according to Paschen's law or Paschen's curve, a DC-glow-discharge is generated in a space between the substrate and the grounded components, such as an opposed electrode, when in the vicinity of the substrate the electric potential $\Phi s$ of the substrate with respect to the earth is equal to or higher than the discharge starting voltage $V_s$ $$V_s = f(P*D),$$

where P*D is the product of the pressure and the distance.

The difference in electric potential between the substrate and the electrostatic clamping electrode increases as the distance therebetween is increased. The increase in the difference of the electric potential plays an important role in generating a DC-glow-discharge. The increase in the electric potential difference can be explained theoretically as follows. The difference in electric potential, $V = \Phi s - \Phi e$, where $\Phi s$ is the potential of the substrate with respect to the earth and $\Phi e$ is the potential of the electrostatic clamping electrode with respect to the earth, can be related to the amount of residual charge through the following equation:

$$V = Q/C \quad (a)$$

The electrostatic capacity C can be expressed by:

$$C = \epsilon S/d \quad (b)$$

where $\epsilon$ represents the dielectric constant between the substrate and the electrostatic clamping electrode, S represents the area of the substrate, and d represents the distance between the substrate and the electrostatic clamping electrode.

By substituting the equation (b) for C in equation (a), we obtain $$V = Qd/\epsilon S = k*d, (k \text{ is constant}) \quad (c)$$

The amount of residual static charge Q which lingers on the substrate remains constant unless the substrate is grounded. Since ∈ and S are each constant, the electric potential difference V between the substrate and the electrostatic clamping electrode is proportional to the distance d between the substrate and the electrostatic clamping electrode. Thus, the difference V in the electric potential increases with increasing distance d between the substrate and the electrostatic clamping electrode.

The increase in distance d between the substrate and the electrostatic clamping electrode, corresponds to an increase in the electric potential Φs of the substrate with respect to the earth. Because the substrate, which is charged with a static charge Q having a polarity opposite to that of the static charge of the electrode, is separated from the electrode in an electric field E (which is equal to a constant value k corresponding to the ratio V/d or Q/∈S), the electric potential Φs of the substrate with respect to the earth increases while the electric potential Φe of the electrode with respect to the earth is kept constant. Accordingly, the electric potential Φs of the substrate with respect to the earth, which is equal to the sum of V and Φe or to the sum of kd and Φe (Φs=V+Φe=kd+Φe), increases as the distance d between the substrate and the electrode increases. This signifies that the electric potential Φs with respect to the earth increases with the increasing difference V in the electric potential.

In the space between the substrate and the electrostatic clamping electrode the DC glow discharge is not generated. The generation of a DC glow discharge requires an increase of the strength of the electric field in the space. Paschen's law implies such requirement for the generation of the DC glow discharge. The electric field between the substrate and the electrostatic clamping electrode is constant irrespective of the distance between them.

$$E=V/d=k*d/d=k=Q/\in S$$

However, the strength of the electric field between the substrate and the grounded members, such as the opposed electrode increases corresponding to the increase of the distance between the substrate and the electrostatic clamping electrode.

It can be easily understood from the foregoing that, for example, when a pin is made to protrude from the electrostatic clamping electrode in order to lift the substrate, in the course of lifting the substrate, the electric potential Φs of the substrate with respect to the earth reaches the discharge starting voltage Vs, which is determined by the distance D between the substrate and a grounded member in the vicinity of the substrate, for instance, the distance between the substrate and the opposed electrode, as well as the pressure P of the ambient gas around the substrate. At the time Φs=Vs or more, a DC-glow-discharge is generated in a space between the substrate and the grounded member. Where the DC glow discharge is generated in the vicinity of the substrate is determined by the space where its atmosphere first satisfies Paschen's law, in the course of the lifting of the substrate (in the course of increasing Φs), of the spaces defined between the substrate and the grounded members or components.

The distance d between the substrate and the electrostatic clamping electrode cannot be increased without limits because the substrate may thereby be deformed or may break. The distance d can be increased more by exerting a larger force for removing the substrate. If a locally intense force is applied to the substrate in the state where an electrostatic clamping force is uniformly applied to the entire substrate by the residual charge, the substrate may easily give or form cracks at the portions where the locally intense force is exerted.

Consequently, the distance d must be set so that no stress or damage may be caused to the substrate. Most preferably, the substrate is separated from the electrostatic clamping electrode such that a small gap is formed between the substrate and the electrostatic clamping electrode. The mechanism for effecting the substrate removal method according to the present invention should preferably be equipped with a lifting mechanism for controlling the height at which the pin protrudes so that a small gap might be formed between the substrate and the electrostatic clamping electrode without damage to the substrate. Furthermore, the pins should preferably be arranged so that they might lift portions other than the edges of the substrate. The present inventors have confirmed by repeated experimentation of removing the substrate that the edges of the substrate easily suffer chipping or that the substrate may be raised at a tilt if the pins protrude at portions corresponding to the edges of the substrate.

Since the distance d is limited to that of a small gap, there is an upper limit in the increase of the electric potential Φs of the substrate with respect to the earth. It is difficult to control the generation of a DC-glow-discharge by controlling only the distance between the substrate and the electrostatic clamping electrode, i.e., the electric potential Φs of the substrate with respect to the earth. However, the generation of the DC-glow-discharge can be most readily operated by adjusting the pressure of the ambient gas existing in the vicinity of the substrate according to Paschen's law. The ambient gas that exists in the vicinity of the substrate may be any gas capable of acting as a discharge medium for generating a DC-glow-discharge in the vicinity of the substrate. More specifically, for example, a process gas, a residual gas which remains after processing the substrate, or a purge gas to expel the residual gas out of the process chamber can be provided in the vicinity of the substrate. From the viewpoint of controlling the pressure of the gas, the use of the gas introduced into the process chamber, i.e., a process gas or a purge gas, is most preferred.

The present inventors have found, irrespective of the DC-voltage applied to the electrostatic clamping electrode for electrostatic clamping, that the electric potential of an eight inch diameter semiconductor wafer with respect to the earth is about 4,000 V if the distance of the gap therebetween is set to about 0.1 mm, and that the electric potential increases to about 40,000 V if the distance of the gap increases to about 1 mm. Furthermore, it has been found that a DC-glow-discharge is generated within this range of the electric potential of the wafer with respect to the earth by setting the pressure of the nitrogen ($N_2$) gas to within the range of from 0.1 Pa to 500 Pa. Within this range of $N_2$ gas pressure, it was found to be possible to remove the substrate within 10 seconds, as described hereinafter. Furthermore, even in the state where the residual static charge is not completely eliminated, the substrate could be removed from the electrostatic clamping electrode by gradually lifting the substrate, if the surface potential of the substrate is maintained at a voltage required for a self-sustaining discharge or lower. More specifically, the present inventors have confirmed the sure removal of up to 2,500 wafers operating under the condition wherein an eight-inch diameter semiconductor wafer is removed from the electrostatic clamping electrode when the surface potential thereof attains a value of 220 V, or lower. All of the wafers were removed free from any damage.

Table 1 shows the surface potential of a wafer with respect to the earth as removed by three methods after applying the etching process to the semiconductor wafer held on the electrostatic clamping electrode. A DC-voltage of −1,000 V was applied thereto in a reactive-ion-etching apparatus. The three methods used for removing the wafer are: (1) a method comprising stopping the application of DC-voltage, and, at the instant at which a pin protrudes from the electrode to lift the wafer, a nitrogen gas is introduced at the flow rate of 100 sccm into the process chamber within which the wafer is placed, thereby removing the substrate from the electrode while maintaining a pressure of 20 Pa; (2) a method comprising stopping the application of the DC voltage, and, forcibly removing the wafer from the electrode by lifting the wafer using the pin alone; and (3) a method comprising stopping the application of the DC voltage, introducing nitrogen gas inside the process chamber within which the wafer is placed to attain a pressure set at 20 Pa, evacuating the nitrogen gas after maintaining a pressure of 20 Pa for 1 minute, and lifting the wafer using the pin. The wafer was positioned at a distance of 10 mm from the electrostatic clamping electrode in each case at the instant the surface potential was measured. The surface potential of the wafers was measured using an electrostatic voltmeter model 344 manufactured by TREK Inc. The surface potential of a wafer on the electrode after the application of a DC-voltage was ceased was 370 V.

TABLE 1

| Method of Removing the Wafer | (1) | (2) | (3) |
|---|---|---|---|
| Surface Potential (V) | 200 | 2,000 | 1,850 |

The surface potential of the wafer removed from the electrode according to method (1) is considerably lower than those of the wafers removed by methods (2) and (3). This means that the wafer loses a considerable amount of residual static charge by the DC-glow-discharge generated in the vicinity of the wafer. Based on the distance between the wafer and the electrode, as well as on the pressure of the nitrogen gas, it is assumed that the DC-glow-discharge is generated in the gap between the wafer and the opposed electrode. It can be seen that the gas molecules that have been charged by the DC-glow discharge have removed the residual static charge from the wafer.

The surface potential of the wafer removed by method (2) shows that a large amount of residual static charge is left on the wafer. The surface potential of the wafer removed by method (3) is essentially equal to that of the wafer removed by method (2).

The results show that the residual static charge that lingers in the substrate cannot be eliminated to a sufficient degree by simply introducing a nitrogen gas into the process chamber and evacuating it thereafter. The surface potential of the wafers removed by methods (2) and (3) is lower than the the electric potential (at d=10 mm) estimated from the equation (3), considering the surface potential (370 V) of a wafer placed on the electrode (at d≈0). This is ascribed to the influence of stray capacitance.

Thus, it can be seen from the results above, that when removing a wafer from the electrode, it is important to fill the process chamber with a gas (ambient gas) to make the space in the vicinity of the substrate into an atmosphere suitable for generating an electric discharge. Thus, a mechanism for effecting the method of removing a substrate according to the present invention should preferably be equipped with a sequencer for sequentially activating the introduction of the ambient gas, the protrusion of pins, and the control of the gas pressure.

Table 2 shows the time necessary for a semiconductor wafer to attain a surface potential of 100 V or less in a process chamber for a reactive-ion-etching apparatus. After the semiconductor wafers, which were made to hold onto the electrostatic clamping electrode at a DC-voltage of −1,000 V were etched, they were subjected to removal by introducing nitrogen gas into the process chamber at the instant the wafers were lifted with four pins, The pressure of the nitrogen gas was made to vary, namely at 0.05 Pa, 0.1 Pa, 10 Pa, 50 Pa, 500 Pa, and 600 Pa. The pins were made to protrude to a height of from about 0.1 mm to about 1 mm.

TABLE 2

| Pressure (Pa) | 0.05 | 0.1 | 10 | 50 | 500 | 600 |
|---|---|---|---|---|---|---|
| Time (sec) | 40 | 10 | 2 | 1 | 3 | 15 |

The table indicates that a surface potential of 100 V or less is attained within 10 seconds when the nitrogen gas is filled at a pressure in the range of from 0.1 to 500 Pa. This signifies that an electric discharge is generated between the wafer and the electrode at a gap of from about 0.1 mm to about 1 mm at a nitrogen gas pressure of from 0.1 to 500 Pa.

The present invention is described in further detail below by referring to the preferred embodiment according to the present invention. It should be understood, however, that the present invention is not to be construed as being limited to the examples below.

EXAMPLES

FIG. 1 shows a lateral cross-sectional view of a preferred embodiment of the present invention. More particularly, it is a lateral cross-sectional view of a substrate removal mechanism built into an electrode in a process chamber modulized for use in parallel-plate-type reactive ion etching in an integrated module multi-chamber dry-etching system with the trade name "ANELVA-4100". Referring to FIG. 1., the substrate removal mechanism comprises a pipe 1 for introducing a gas into a vacuum vessel 10, valves 1a and 1b, an etching gas supply source 20, and an ambient gas supply source 21. It also comprises an electrostatic clamping electrode 2, a dielectric sheet 3 provided on the electrostatic clamping electrode 2, a DC-power source 4 for applying a DC-voltage to the electrostatic clamping electrode 2, an 8-inch diameter semiconductor wafer 5, a support 6, a radio-frequency power source 14, and an opposed electrode 15. The mechanism further comprises an automatic pressure controller (APC) 7, an evacuation valve 7a, and an evacuation system 7b consisting of a turbo molecular pump and an oil-sealed rotary pump. The APC 7 controls the degree of opening of the valve 7a to control the pressure inside the vacuum vessel. Lifting pins 9 are provided inside the electrostatic clamping electrode 2. Four lifting pins 9 push up the wafer 5.

Figure 2:
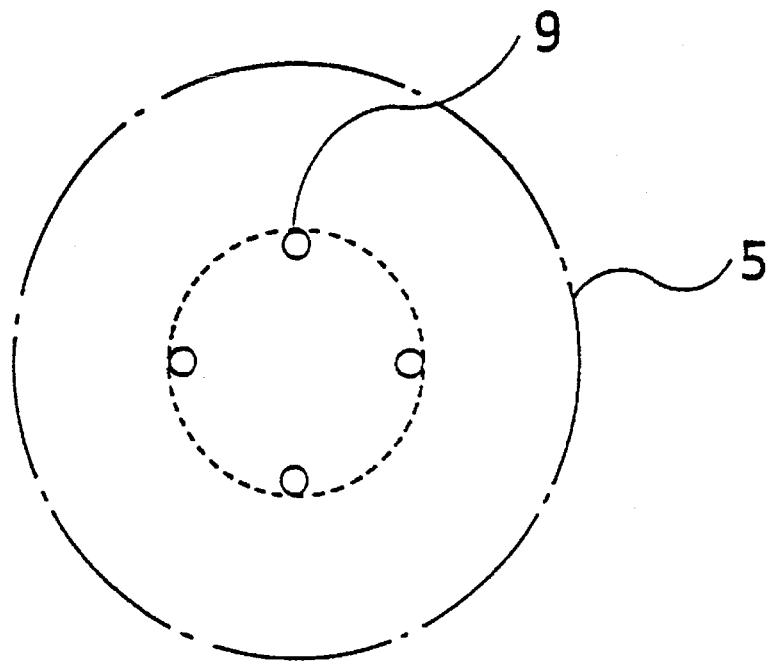
FIG. 2 is a plan view showing the arrangement of the pins.
Figure 3:
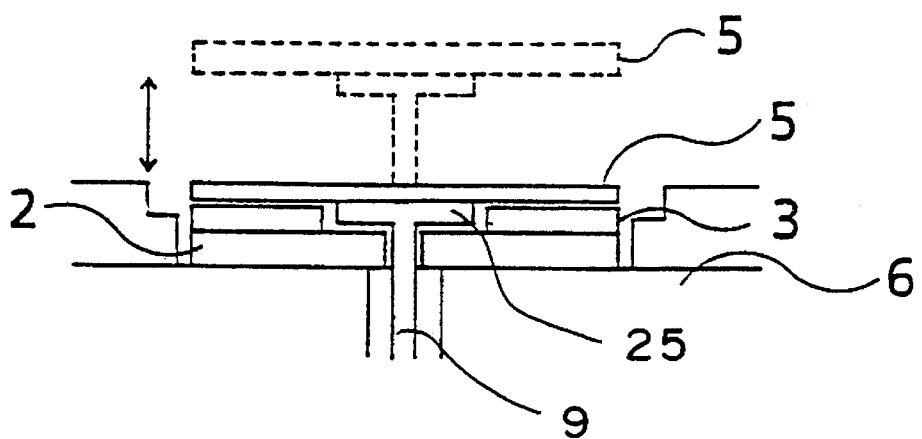
FIG. 3 is a cross-sectional view of a pin having a circular pedestal at an end thereof.

As shown in FIG. 2, the lifting pins 9 are arranged at equal distances on the circumference of a circle having a diameter smaller than that of the substrate. As shown in FIG. 3, the lifting pin 9 may by provides with a circular pedestal 25 for lifting the substrate 5 from the surface of the dielectric sheet 3. The pins 9 protrude and retract from the surface of the dielectric sheet 3 by operating a driver member 13a via a driver shaft 13 supported by bearings 11a and 11b. A driver mechanism 22 is set on a frame 12 to move the driver member 13a upward and downward. The driver mechanism 22 can be controlled such that the height of the lifting pins 9 upon their protrusion do not cause damage to the wafer 5.

More specifically, the height of the lifting pins 9 is controlled to be within the range of from about 0.1 to about 1 mm. A sequencer 23 is provided to control the degree to which the valves 1a and 1b are opened, the operation (or activation) of the APC 7, and the operation (or activation) of the driver mechanism 23.

EXAMPLE 1

The process of removing a substrate from an electrode, while the substrate removal mechanism is built in an electrode in a process chamber modulized for use in parallel plate type reactive ion etching in the integrated module multi-chamber dry-etching system "ANELVA 4100" is described below as a preferred embodiment of the present invention. Referring to FIG. 1, a wafer 5 is mounted on an electrostatic clamping electrode 2 via a dielectric sheet 3 using a transferring robot not shown in the FIG. 1. DC-voltage is applied to the electrostatic clamping electrode 2 using the DC-power source 4. A mixture of $CF_4$ and $O_2$ gases is introduced as the etching gas into the process chamber 10 through pipe 1 by opening the valve 1a. The pressure of the etching gas is set to about 10 Pa using the APC 7. Subsequently, an RF-power is supplied to the electrostatic clamping electrode 2 from an RF power source 14 to generate a reactive plasma between the electrostatic clamping electrode 2 and the opposed electrode 15. Thus, a DC-equivalent circuit model inclusive of the electrostatic clamping electrode 2 and the DC-power source 4 is established through the generation of the plasma. By the plasma generation, the wafer 5 is made to hold onto the electrostatic clamping electrode 2 and further the surface of the wafer 5 is subjected to an etching process. The etching process is completed by turning off the RF-power source 14 and the DC-power source 4. Even after the completion of the process, the sequencer 23 activates the driver mechanism while introducing an etching gas mixture of $CF_4$ and $O_2$ at a flow rate of 90 and 10 sccm, respectively, through the gas pipe 1. Thus, lifting pins 9 that are retracted inside the electrostatic clamping electrode 2 are made to protrude from the surface of the dielectric sheet 3 at a height of about 0.5 mm. On the other hand, the sequencer 23 activates the APC 7 to set the pressure of the etching gas to about 10 Pa. The lifting pins 9 are further elevated once the wafer 5 starts to separate from the electrostatic clamping electrode 2 in order to completely remove the wafer 5 from the electrode 2. The total time necessary, from the initiation of the protruding of the lifting pins 9 to the completion of the removal of the substrate, was about 2 seconds. As described in the foregoing, the first embodiment according to the present invention comprises using the etching gas as the ambient gas for generating a DC-glow-discharge between the wafer 5 and the electrostatic clamping electrode 2 upon removing the wafer 5.

EXAMPLE 2

The second preferred embodiment of a removal method was effected using an etching gas as an ambient gas under the other conditions which are the same as in Example 1. The ambient gas was a mixture of $CF_4$ and $CHF_3$ gases introduced at a rate of 150 and 50 sccm, respectively. For the removal of the wafer 5, the pressure of the ambient gas was set at 20 Pa. It took about 1 second from the initiation of the protruding of the lifting pins 9 to the completion of the removal of the wafer 5 from the electrode 2.

EXAMPLE 3

The third preferred embodiment of a removal method was effected, using an argon gas as the ambient gas under the other conditions which are the same as in Example 1. After the etching process, the argon gas is introduced into the process chamber 10 at a flow rate of 200 sccm by opening the valve 1b after shutting the value 1a using the sequencer 23. The sequencer 23 activates the driver mechanism upon the introduction of the argon gas to make the lifting pins 9 protrude at a height of about 0.5 mm. At the same time, the sequencer 23 activates the APC 7 to set the pressure of the argon gas to about 10 Pa. It took about 1 second from the time the lifting pins 9 were made to protrude to the completion of the removal of the wafer 5 from the electrode.

EXAMPLE 4

The fourth preferred embodiment of a removal method was effected, using nitrogen ($N_2$) gas as the ambient gas under the same conditions as those in Example 1. After the etching process, the nitrogen gas is introduced into the process chamber 10 at a flow rate of 200 sccm. The pressure of the ambient gas was set at 20 Pa at the removal of the wafer 5. The sequencer 23 conducted the same process as that in Example 3. It took about 1 second from the initiation of the protruding of the lifting pins 9 until the completion of the removal of the wafer 5 from the electrode.

EXAMPLE 5

A process for the removal of a substrate from an electrode in which a removal mechanism is built in a process chamber modulized for use in helicon wave plasma etching in integrated module multi-chamber dry-etching system "ANELVA-410011" is described below as the fifth preferred embodiment of the present invention. The mechanism for removing a substrate from an electrode is the same as that built in the modulized process chamber for use in parallel-plate-type reactive etching. For details of the helicon wave plasma generating apparatus, U.S. Pat. Nos. 4,990,229 and 5,122,251 may be referred to.

The etching process was effected by introducing chlorine gas into the process chamber and generating a helicon wave plasma. The process was completed by turning off the helicon wave plasma etching apparatus and the DC-power source 4. Then, nitrogen gas was introduced into the process chamber at a flow rate of 200 sccm as the ambient gas, and the pressure inside the chamber was set to about 2 Pa using the APC 7. At the same time, the lifting pins 9 provided inside the dielectric sheet 3 were made to protrude from the surface of the dielectric sheet 3 at a height of about 0.5 mm. As the wafer 5 started to separate from the electrode 2, the lifting pins 9 were further elevated to completely remove the wafer 5 from the electrode 2. It took about 3 seconds from the initiation of the protruding of the lifting pins 9 until the completion of wafer 5 from the electrode.

In the embodiments described above, air might be used as the ambient gas upon removing the substrate from the electrode. In such a case, a valve for ventilation is opened to introduce air into the process chamber.

The foregoing description with reference to examples is made for the plasma-etching process. However, the substrate removal mechanism according to the present invention can be built in any apparatus comprising an electrostatic clamping means for substrates, such as a plasma CVD apparatus, a sputtering apparatus, and a plasma ashing apparatus.

Needless to say, the substrate removal method according to the present invention can be effected with any of the apparatuses enumerated above.

As described in the foregoing, the mechanism and the method according to the present invention enables a rapid and easy removal of substrates from electrodes to which they are held by electrostatic clamping.

While the invention has been described in detail and with reference to specific embodiments thereof, it will be apparent to one skilled in the art that various changes and modifications can be made therein without departing from the spirit and scope thereof.

What is claimed is:

1. A method of removing a substrate from an electrode, comprising:

forming a gap between the electrode and the substrate held thereto by electrostatic clamping;

increasing a difference in electric potential between the substrate and the electrode by forming the gap therebetween, thus generating an electric glow-discharge in a vicinity of the substrate;

reducing residual static charge on the substrate by gas particles charged by the electric-glow discharge; and removing the substrate from the electrode after such reduction.

2. The method of removing a substrate from an electrode as claimed in claim 1, wherein a size of the gap is set in such a manner that electric potential of the substrate with respect to earth attains a voltage required for initiation of the electric glow-discharge, and an ambient gas is supplied in an atmosphere surrounding the substrate having a pressure which is set such that the electric glow-discharge is generated in the vicinity of the substrate.

3. The method of removing a substrate from an electrode as claimed in claim 2, wherein the gap between the substrate and the electrode is within a range of from about 0.1 mm to about 1 mm.

4. The method of removing a substrate from an electrode as claimed in claim 2, wherein the pressure of the-gas existing in the ambient atmosphere surrounding the substrate is within a range of from about 0.1 Pa to about 500 Pa.

5. The method of removing a substrate from an electrode as claimed in claim 2, wherein the difference in the electric potential between the substrate and the electrode induced by forming the gap is proportional to the distance of the gap.

6. The method of removing a substrate from an electrode as claimed in claim 2, wherein the electric potential of the substrate with respect to the earth increases as the distance of the gap between the substrate and the electrode increases.

7. The method of removing a substrate from an electrode as claimed in claim 1, wherein the electric glow-discharge generated in the vicinity of the substrate is a DC-discharge.

8. The method of removing a substrate from an electrode as claimed in claim 7, wherein when the substrate is about eight inches in diameter, the substrate is removed from the electrode when a surface potential of the substrate drops to at least 220 V.

9. The method of removing a substrate from an electrode as claimed in claim 8, wherein nitrogen gas is introduced at a flow rate of 200 sccm and under a pressure of 20 Pa.

10. The method of removing a substrate from an electrode as claimed in claim 1, wherein the substrate is removed from the electrode, after generation of the electric glow-discharge, when the electric potential between the substrate and the electrode becomes one of equal to and less than the voltage required for a self-sustaining discharge.

11. The method of removing a substrate from an electrode as claimed in claim 1, wherein an ambient gas is supplied in the vicinity of the substrate, and the ambient gas is one of air, an inert gas, a nitrogen gas, and a mixture of those gases.

12. The method of removing a substrate from an electrode as claimed in claim 1, wherein ambient gas present in the vicinity of the substrate is a process gas for processing the substrate.

13. The method of removing a substrate from an electrode as claimed in claim 12, wherein the process gas for processing the substrate is a mixture of $CF_4$ and $O_2$ gases.

14. The method of removing a substrate from an electrode as claimed in claim 12, wherein the process gas for processing the substrate is a mixture of $CF_4$ and $CHF_3$ gases.

15. The method of removing a substrate from a electrode as claimed in claim 1, wherein a pin is made to protrude from the surface of the electrode to form the gap between the substrate and the electrode.

16. The method of removing a substrate from an electrode as claimed in claim 15, wherein a height of the pin protruding from the surface of the electrode is set such that the substrate does not suffer damage.

17. The method of removing a substrate from an electrode as claimed in claim 15, wherein a height of the pin protruding from the surface of the electrode is set to be in the range of from about 0.1 mm to about 1 mm.

18. A mechanism for removing a substrate from an electrode, comprising:

an electrostatic clamping mechanism for holding a substrate on the electrode by electrostatic clamping;

means for protruding from a surface of the electrode to form a gap between the substrate and the electrode;

means for introducing a gas to form an ambient atmosphere suitable for generating an electric glow-discharge in a vicinity of the substrate;

means for controlling a pressure of the gas so that the pressure is substantially constant; and a sequencer for sequentially activating the means for introducing the gas, the protruding means, and the means for controlling the gas pressure, by first activating the means for introducing the gas, second activating the protruding means, and third activating the means for controlling the gas pressure.

19. The mechanism for removing a substrate from an electrode as claimed in claim 18, wherein the protruding means is placed below a portion other than an edge of the substrate.

20. The mechanism for removing a substrate from an electrode as claimed in claim 18, further comprising three additional protruding means and the four protruding means are located at equal distances along a circumference of a circle having a diameter shorter than a diameter of the substrate.

21. The mechanism for removing a substrate from an electrode as claimed in claim 18, wherein the protruding means is placed at a center of the substrate and comprises a circular pedestal having a diameter shorter than a diameter of the substrate, and when the circular pedestal is retracted into the electrode, its surface is coplanar with a surface of the electrode.

22. The mechanism for removing a substrate from an electrode as claimed in claim 18, wherein the mechanism further comprises a lifting mechanism for adjusting a height of the protruding means such that the substrate does not suffer damage from the protruding means.

* * * * *